United States Patent
Chin et al.

(10) Patent No.: US 11,264,237 B2
(45) Date of Patent: Mar. 1, 2022

(54) METHOD OF EPITAXY AND SEMICONDUCTOR DEVICE

(71) Applicant: Taiwan Semiconductor Manufacturing Company, Ltd., Hsinchu (TW)

(72) Inventors: Chih-Yun Chin, Taichung (TW); Tzu-Hsiang Hsu, Xinfeng Township (TW); Yen-Ru Lee, Hsinchu (TW); Chii-Horng Li, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/460,745

(22) Filed: Jul. 2, 2019

(65) Prior Publication Data

US 2020/0105526 A1  Apr. 2, 2020

Related U.S. Application Data

(60) Provisional application No. 62/738,809, filed on Sep. 28, 2018.

(51) Int. Cl.
*H01L 29/78* (2006.01)
*H01L 21/02* (2006.01)
*H01L 21/8238* (2006.01)
*H01L 27/092* (2006.01)
*H01L 29/66* (2006.01)
*H01L 21/768* (2006.01)

(52) U.S. Cl.
CPC .. *H01L 21/02532* (2013.01); *H01L 21/76871* (2013.01); *H01L 21/823814* (2013.01); *H01L 21/823821* (2013.01); *H01L 27/0924* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 8,962,400 B2 | 2/2015 | Tsai et al. |
| 9,093,514 B2 | 7/2015 | Tsai et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,418,897 B1 | 8/2016 | Ching et al. |

(Continued)

*Primary Examiner* — Benjamin P Sandvik
(74) *Attorney, Agent, or Firm* — Slater Matsil, LLP

(57) ABSTRACT

A transistor is provided including a source-drain region, the source-drain region including a first layer wherein a first average silicon content is between about 80% and 100%, a second layer wherein a second average silicon content is between zero and about 90%, the second average silicon content being smaller than the first average silicon content by at least 7%, and the second layer disposed on and adjacent the first layer, a third layer wherein a third average silicon content is between about 80% and 100%, and a fourth layer wherein a fourth average silicon content is between zero and about 90%, the fourth average silicon content being smaller than the third average silicon content by at least 7%, and the fourth layer disposed on and adjacent the third layer.

20 Claims, 13 Drawing Sheets

(56) References Cited

U.S. PATENT DOCUMENTS

| | | |
|---|---|---|
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,812,363 B1 | 11/2017 | Liao et al. |
| 9,859,380 B2 | 1/2018 | Lee et al. |
| 10,032,873 B2 * | 7/2018 | Chang .................. H01L 29/36 |
| 2008/0197412 A1 * | 8/2008 | Zhang ................. H01L 29/165 257/344 |
| 2009/0039399 A1 * | 2/2009 | Sudo ................. H01L 29/6653 257/288 |
| 2009/0108308 A1 * | 4/2009 | Yang ................. H01L 29/7848 257/288 |
| 2011/0062498 A1 * | 3/2011 | Yang ............... H01L 29/66636 257/213 |
| 2013/0026538 A1 * | 1/2013 | Liao .................. H01L 29/7848 257/190 |
| 2014/0134814 A1 | 5/2014 | Wong et al. |
| 2015/0187940 A1 * | 7/2015 | Huang ............... H01L 29/7848 257/384 |
| 2016/0027918 A1 * | 1/2016 | Kim .................... H01L 29/165 257/401 |
| 2017/0186748 A1 * | 6/2017 | Lee ................ H01L 21/823821 |
| 2018/0182756 A1 | 6/2018 | Lee et al. |
| 2020/0027895 A1 * | 1/2020 | Cho .................. H01L 29/7854 |

* cited by examiner

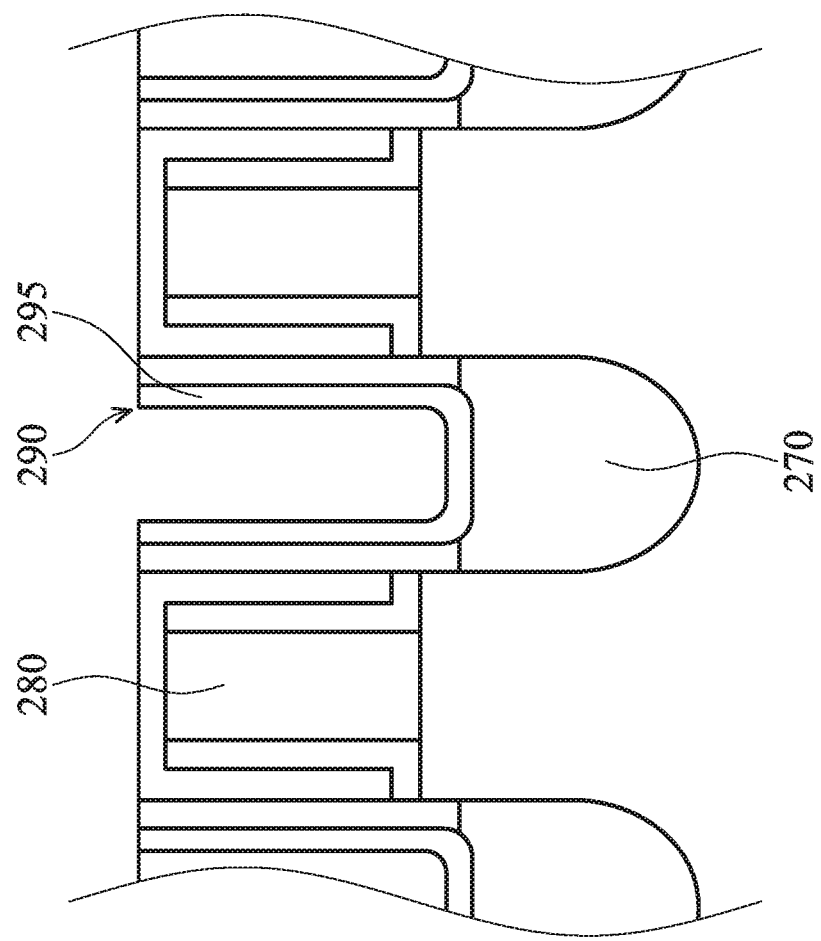

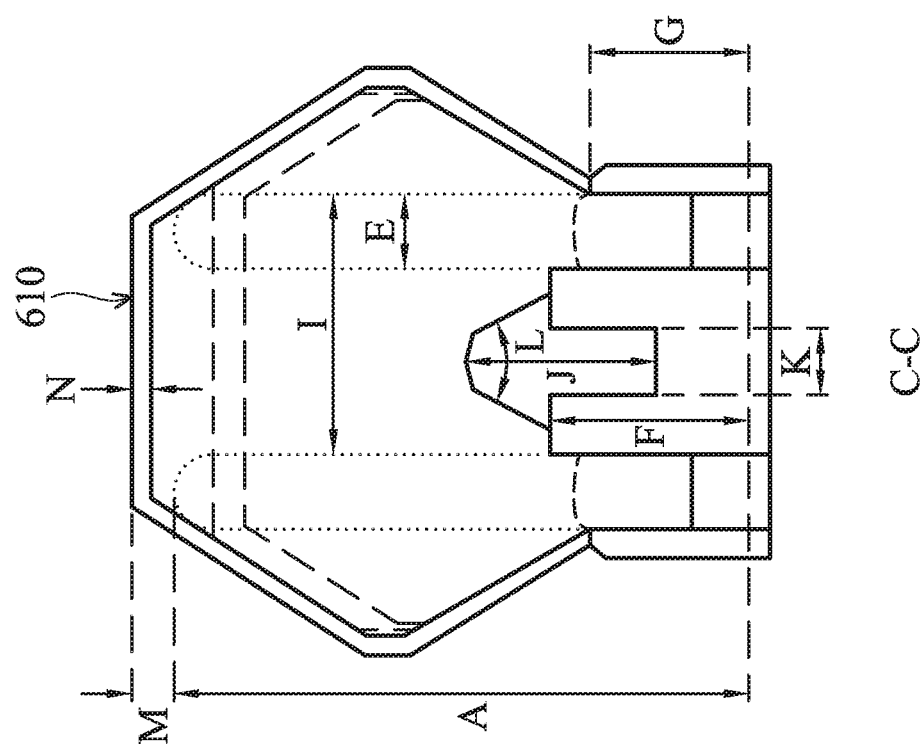
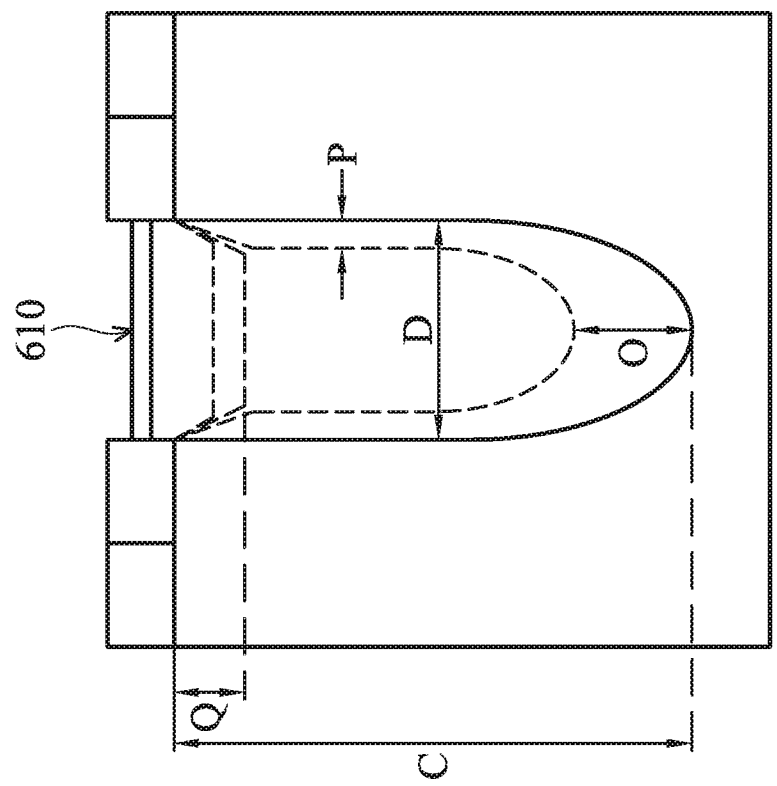
FIG. 6

FIG. 7

| Label | Description | Size |
|---|---|---|
| A | Fin height | 10 ~ 100 nm |
| C | Recess depth | 10 ~ 100 nm |
| D | Source-drain width | 10 ~ 100 nm |
| E | Fin width | 3 ~ 30 nm |
| F | Inner fin sidewall height | 0 ~ 60 nm |
| G | Outer fin sidewall height | 0 ~ 60 nm |
| I | Fin pitch | 20 ~ 100 nm |
| J | Air-gap height | 0 ~ 50 nm |
| K | Fin spacer to spacer width | 0 ~ 50 nm |
| L | Intra-fin epitaxy angle | 10 ~ 150 nm |
| M | Final extent over fin | -10 ~ 20 nm |
| N | Thickness of final layer | 0 ~ 10 nm |
| O | Bottom thickness of pre-seeding layer | 0 ~ 50 nm |
| P | Sidewall thickness of pre-seeding layer | 0 ~ 30 nm |
| Q | Extent of first seeded layer over fin top position | -20 ~ 10 nm |
| T | Thickness of seeding layers | 1 monolayer ~ 5 nm |

US 11,264,237 B2

METHOD OF EPITAXY AND SEMICONDUCTOR DEVICE

PRIORITY CLAIM AND CROSS-REFERENCE

This application claims the benefit of U.S. Provisional Application No. 62/738,809, filed on Sep. 28, 2018, which application is hereby incorporated herein by reference.

TECHNICAL FIELD

This invention relates generally to semiconductor manufacturing, and more particularly to devices comprising epitaxial layers and methods of manufacturing them.

BACKGROUND

The use of Fin Field-Effect Transistors (FinFETs) in lieu of planar transistors is among several recent developments in the semiconductor industry. In a FinFET, the transistor channel is formed substantially within a structure with a high aspect ratio, commonly called a fin. A gate covers not only the top, but also the sides of the fin. This configuration offers a number of advantages over planar transistors, including better control over channel inversion and greater reliability for the same performance.

Due to the three-dimensional nature of FinFET structures, the manufacturing process for FinFETs is typically more complex than that of planar transistors. In some cases, epitaxial growth, often selective epitaxial growth, may be employed to form various features in FinFET structures. In addition, strain engineering may be used to further enhance the performance of FinFET transistors. In an application of strain engineering, the compositions of materials grown by epitaxial methods are selected so as to apply desired types and levels of stress on FinFET channels. Proper application of stress serves to enhance the mobility of charge careers in FinFET channels and thus improves FinFET performance.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 2A-2E are simplified cross-sectional illustrations of two example FinFET devices at selected stages of an example FinFET manufacturing process;

FIG. 6 contains simplified cross-sectional views of an embodiment of a p-type FinFET source-drain structure, with reference labels in relation to FIG. 7;

FIG. 7 is a table containing ranges of sizes corresponding to the features labeled in FIG. 6;

Figure 1:
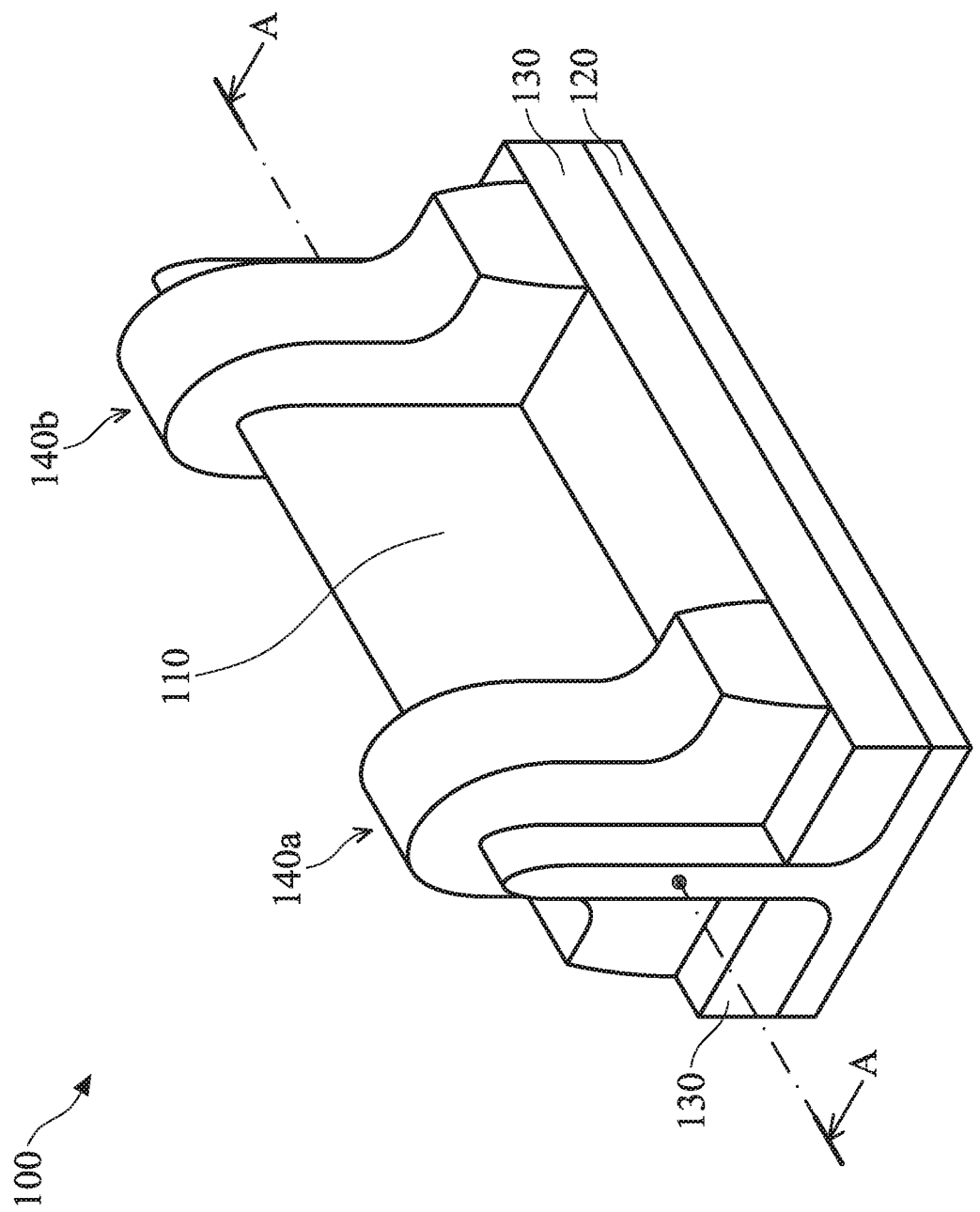
FIG. 1 is a simplified perspective view of selected elements of two FinFET transistors at a stage of an example FinFET manufacturing process.

Corresponding numerals and symbols in different figures generally refer to corresponding parts unless otherwise indicated. The figures are drawn to illustrate clearly the relevant aspects of embodiments of the present disclosure and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein the expression $Si_{1-x}Ge_x$ signifies silicon if the germanium content x is zero, or equivalently, 0%. Likewise, the expression $Si_{1-x}Ge_x$ signifies germanium if the germanium content x is 1, or equivalently, 100%. In such expressions, the value of x or similar variables may be stated as a fraction or as the equivalent percentage, for example as 0.2 or its equivalent, 20%. Furthermore, the terms source-drain region and source-drain structure are used interchangeably, unless indicated otherwise expressly or by the context in which the term(s) are used.

Some embodiments disclosed herein are described in the context of a stage in a FinFET manufacturing process. FIG. 1 is a simplified perspective view of selected elements of two FinFET transistors at a stage of an example FinFET manufacturing process. At the stage of the example manufacturing process illustrated in FIG. 1, a fin 110 has been formed on a substrate 120, isolation regions 130 have been formed to isolate the fin 110 from other fins (not shown), and gate assemblies 140a and 140b have been disposed along sidewalls and over top surfaces of the fin 110. During the operation of a completed FinFET structure, transistor channels are formed in portions of the fin 110 that are covered by the gate assemblies 140*a* and 140*b*.

A cross section A-A is defined herein as one taken along a plane perpendicular to the substrate 120 and passing through the line A-A, at any stage of the manufacturing process. This cross-sectional view is employed in FIGS. 2A-2E.

Although FIG. 1 is included herein primarily to define the A-A cross section, it also provides a graphical basis for a simplified discussion of relevant elements of a FinFET structure. The substrate 120 may be a bulk semiconductor substrate, a semiconductor-on-insulator (SOI) substrate, or the like. Moreover, it may include one or more semiconductor layers deposited, for example by epitaxy, on and differing in composition from the underlying bulk material. Moreover, the semiconducting layers of the substrate may be undoped or doped with one or more n-type or p-type dopants introduced during bulk crystal growth or by ion implantation or diffusion. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate may include an elemental semiconductor including silicon (Si); a compound semiconductor; an alloy semiconductor, or a combination thereof.

Fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Fins may be produced by various methods, including etching away regions of a starting material, or depositing fin material into narrow trenches. In FIG. 1, the fin 110 has been formed by etching away regions of the substrate 120. In such a process, one or more mask layers may be deposited on the substrate 120. Such mask layers may include or be silicon nitride, silicon oxynitride, silicon carbide, silicon carbon nitride, the like, or a combination thereof. Subsequently, a fin pattern is transferred to the mask layer(s) and a substantially anisotropic etch is employed to etch away substrate material except in the fin areas. The isolation regions 130 may include or be an insulating material such as silicon oxide, silicon nitride, the like, or a combination thereof, formed by a suitable deposition process. For example, the isolation regions 130 may include silicon oxide formed by a flowable CVD process. Other insulating materials formed by any acceptable process may also be used. A planarization process, such as a Chemical Mechanical Polish (CMP), may be used to remove any excess material such that the top surfaces of the insulating material and the fin 110 are coplanar. The insulating material may then be recessed to form the isolation regions 130, allowing the fin 110 to protrude from and between the isolation regions 130. The insulating material may be recessed using any acceptable etch process, such as one that is selective to the material of the insulating material. Depending on the details of the process, top surfaces of the isolation regions 130 may be flat as illustrated, be convex or concave, or exhibit more complex shapes.

Alternative manufacturing processes, in which fins are produced by depositing fin material into narrow trenches, are more complex than those described above and may involve additional features not illustrated in FIG. 1. In an example process, a dielectric layer may be formed over a top surface of the semiconductor substrate 120, trenches can be etched through the dielectric layer, fin material can be epitaxially grown in the trenches, and the dielectric layer can be recessed such that the fin material protrudes from the dielectric layer to form fins. The epitaxial material may be the same as or different from the substrate, and it may be undoped, or doped during or after growth. In such processes, it may be particularly advantageous to grow different materials for n-type and p-type FinFETs, respectively, for example to maximize career mobility in each device type. In particular, the fin material for a p-type FinFET may be silicon or silicon germanium.

Figure 2A:
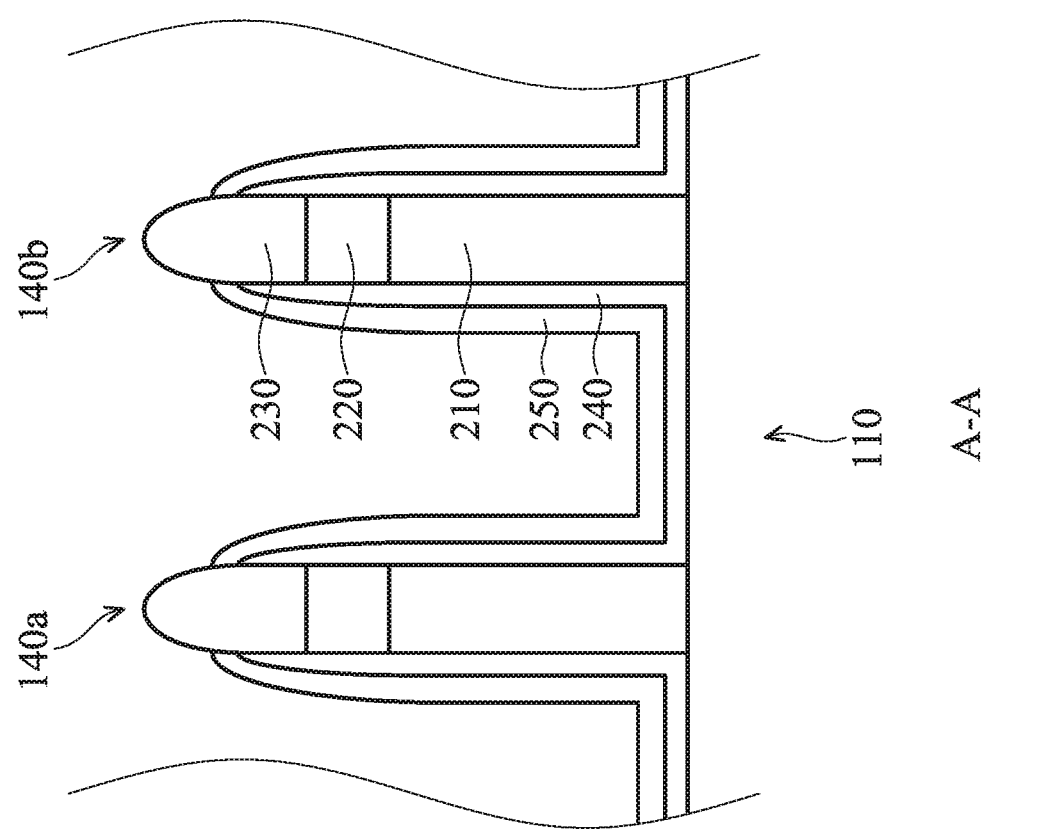

The gate assemblies 140*a* and 140*b* may comprise a number of components. FIG. 2A is a schematic cross-sectional view of two example FinFET devices following the formation of gate assemblies in an example FinFET manufacturing process. The cross section is taken along the A-A cross section defined in FIG. 1. The gate assemblies 140*a* and 140*b* are illustrated disposed over the top surfaces of the fin 110. In this example, each gate assembly comprises a gate 210, a silicon-nitride layer 220, an oxide hard mask 230, and sidewalls 240 and 250. In addition, a thin gate dielectric (not shown) is disposed over the fin 110, and under the gate 210 and the sidewall 240. The gate dielectric may include or be silicon oxide, silicon nitride, a high-k dielectric, the like, or multi-layers thereof. A high-k dielectric may include an oxide or silicate of hafnium or similar metals. The gate dielectric may be thermally and/or chemically grown on the fin 110, or conformally deposited, by a suitable deposition technique. In a replacement gate process, the gate 210 may be removed and replaced by a permanent gate at a later stage of the manufacturing process. In such cases, the gate 210 may be amorphous or polysilicon, and is referred to as a dummy gate. In some manufacturing processes, lightly doped drain (LDD) regions (not shown) may be formed in the fin material after the formation of the gate assemblies, for example by dopant implantation.

Figure 2B:
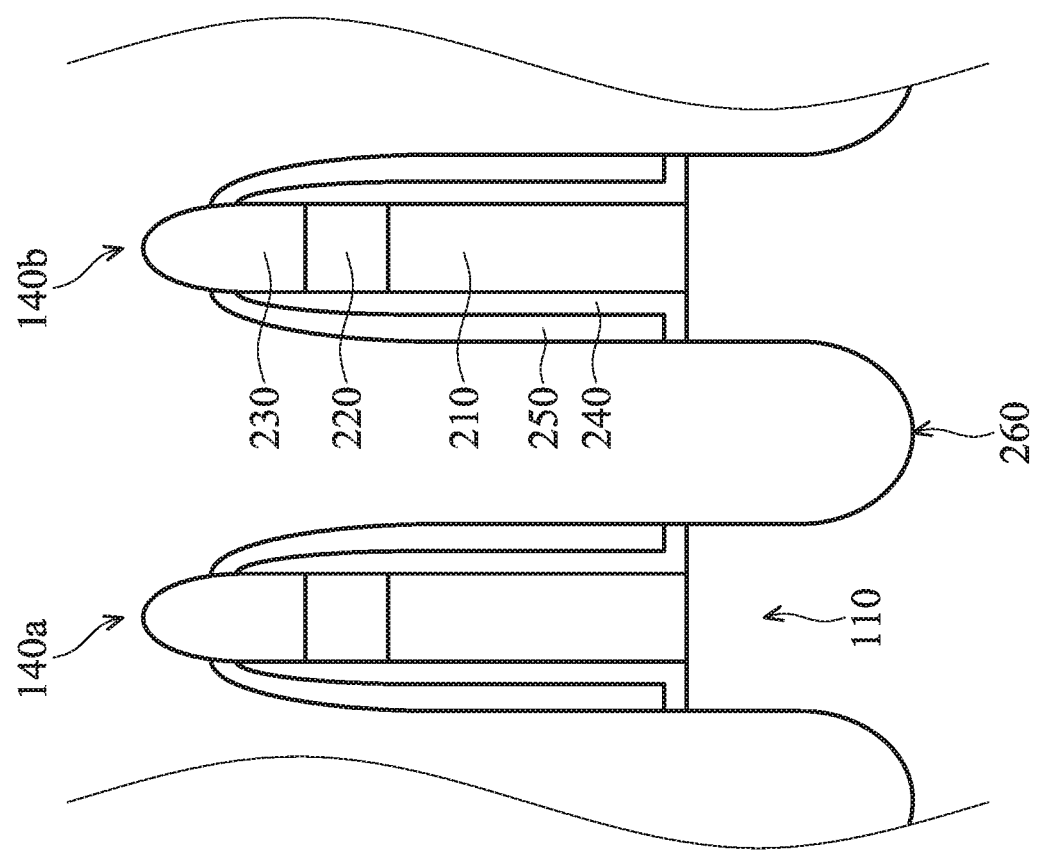

FIG. 2B is a schematic cross-sectional illustration of two example FinFET devices following etching a source-drain recess in an example FinFET manufacturing process. A recess 260 has been etched in the fin 110. The etch process can be isotropic or anisotropic, and it may be selective with respect to one or more crystalline planes of the fin material. As a result, the recess 260, shown in FIG. 2B as having a round bottom profile, can in practice have various profile shapes based on the etch process implemented. The etch process may be a dry etch, such as a RIE, NBE, or the like, or a wet etch, such as one using tetramethylammonium hydroxide (TMAH), ammonium hydroxide (NH$_4$OH), or other etchants.

Figure 2C:
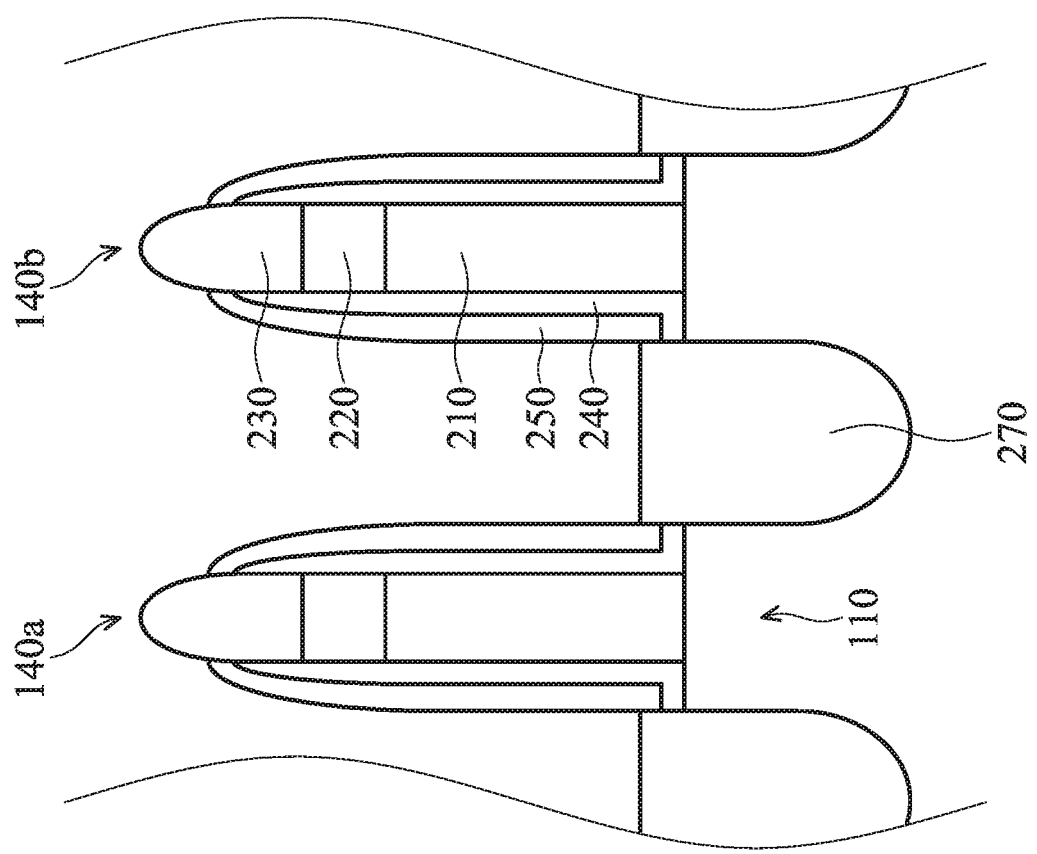

FIG. 2C is a schematic cross-sectional illustration of two example FinFET devices following source-drain epitaxy in an example FinFET manufacturing process. A source-drain 270 is grown in the recess 260 of FIG. 2B. The source-drain 270 is in physical and electrical contact with the fin 110, and may serve as a source or a drain for a FinFET device. For example, the source-drain region 270 may serve as the source for a transistor comprising gate assembly 140*a* and the drain for a transistor comprising gate assembly 140*b*, or it can serve as the source for both, or the drain for both, depending on circuit connections and applied biases.

The source-drain material in the source-drain region 270 may include or be silicon germanium, silicon, or germanium, (i.e., $Si_{1-x}Ge_x$, where the germanium content x can be between 0 and 100 percent), silicon carbide, silicon phosphorus, a compound semiconductor, or the like. The source-drain material may be deposited in the source-drain region 270 by epitaxial growth or by selective epitaxial growth, using techniques such as vapor phase epitaxy (VPE), metal-organic CVD (MOCVD), molecular beam epitaxy (MBE), the like, or a combination thereof. In addition, the source-drain material may be doped, for example by in-situ doping during epitaxial growth and/or by ion implantation subsequent to epitaxial growth.

To improve the performance of a FinFET device, the source-drain material may be selected so as to apply stress to the fin regions covered by the gate assemblies. For example, for a p-type FinFET, if the fin material is $Si_{1-x}Ge_x$, the source-drain material may be chosen to be or include a region of $Si_{1-y}Ge_y$, where the germanium content y used in the source-drain region is larger than the germanium content x in the fin region. The larger the difference between the source-drain germanium content y and the fin germanium content x, the larger the stress applied to the fin region, and the larger the improvement in transistor performance. In addition, selective epitaxial growth (SEG) may be employed to ensure that the source-drain material grows on the underlying semiconductor material in the recess 260 of FIG. 2B, but not on other surfaces such as silicon oxide, silicon nitrides, or the like. Hydrogen chloride (HCl) may be used in the growth process, together with gases containing Si and/or $Ge_x$ to promote selectivity.

Figure 2E:
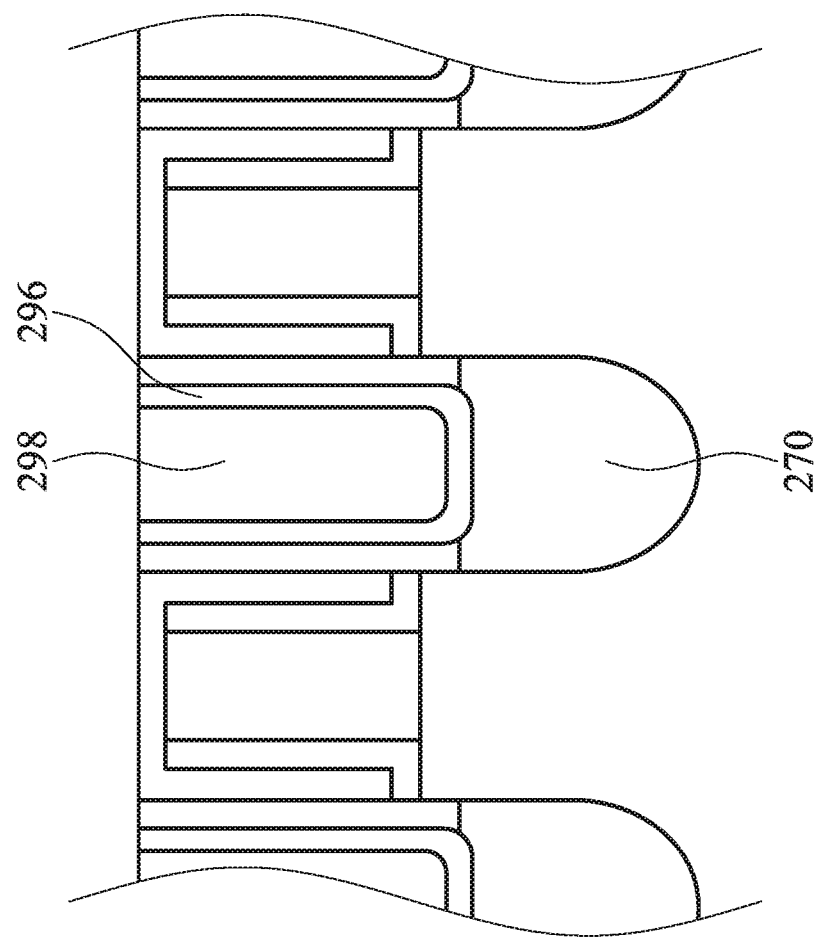

As described below, an advantageous application of some embodiments disclosed herein may be during the epitaxial growth of the source-drain regions of a finFET device. However, to further elucidate the context of such an application, two additional stages of a FinFET manufacturing process are briefly described herein. FIG. 2D is a schematic cross-sectional illustration of two example FinFET devices following silicide formation in an example FinFET manufacturing process. At this stage, the silicon-nitride layer 220 and the hard mask 230 of FIG. 2A have been removed, and a replacement gate 280 has been disposed in substantially the same region as that occupied by the gate 210 of FIG. 2A in earlier stages of the manufacturing process. The replacement gate 280 may be or comprise materials containing metals such as Co, Ru, Al, W, Cu, multi-layers thereof, or a combination thereof. The gate dielectric under the gate 210 of FIG. 2A has also been replaced with one or more dielectric and/or work-function adjustment layers (not shown). In addition, a silicide region 295 has been formed by reacting a barrier layer 290 with the material in the source-drain region 270. Planarization has been achieved, for example, by CMP. FIG. 2E is a schematic cross-sectional illustration of two example FinFET devices following contact plug formation in an example FinFET manufacturing process. A contact plug 298 allows electrical connection to the source-drain region 270 through the silicide region 296.

Figure 3:
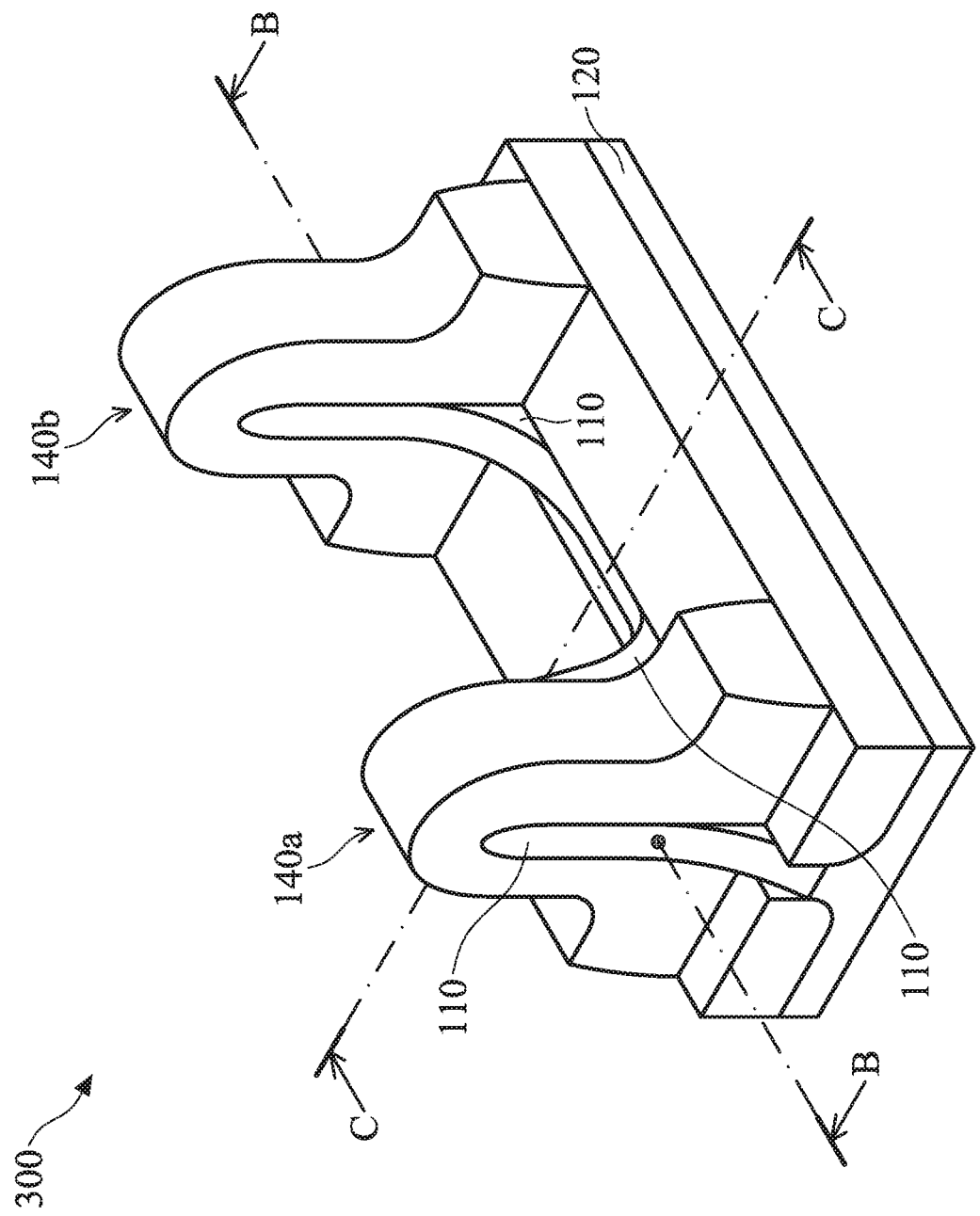
FIG. 3 is a simplified perspective view of selected elements of two FinFET structures following the source-drain recess stage of an example FinFET manufacturing process.
Figure 4:
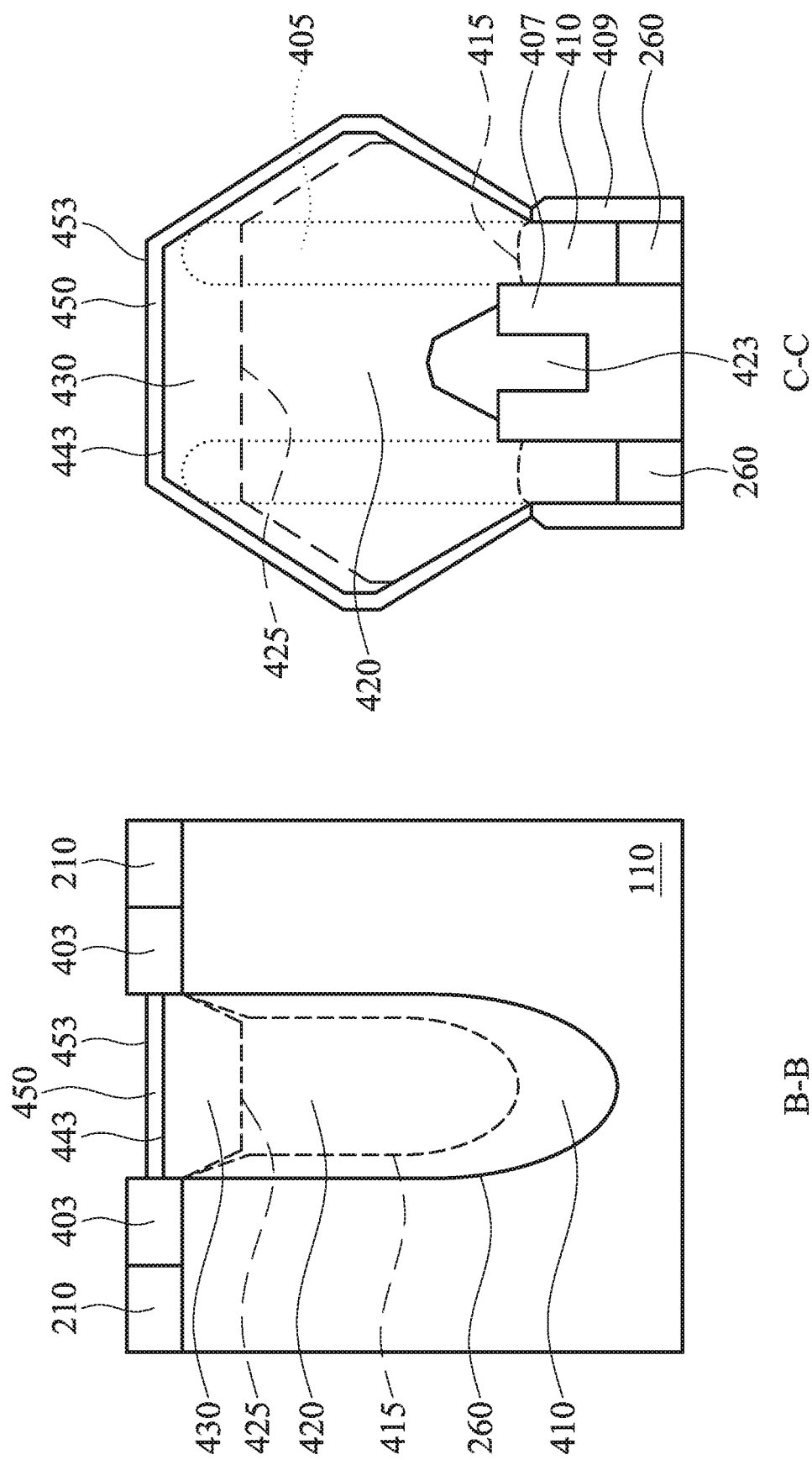
FIG. 4 contains cross-sectional views of an embodiment of a p-type FinFET source-drain structure comprising two seeding layers.
Figure 5:
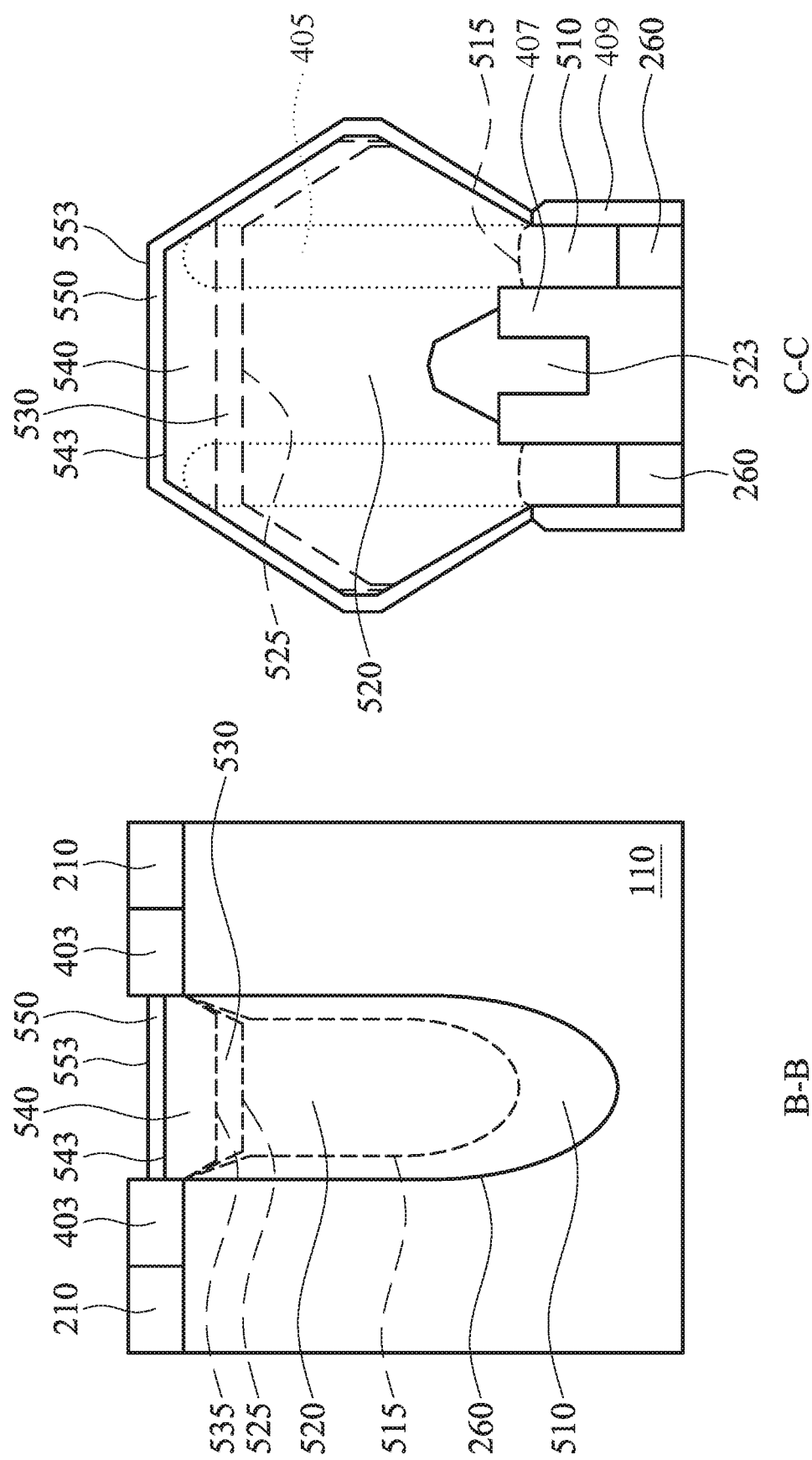
FIG. 5 contains cross-sectional views of an embodiment of a p-type FinFET source-drain structure comprising three seeding layers.

FIG. 3 is a schematic perspective view of selected elements of two FinFET structures following the source-drain recess stage of an example FinFET manufacturing process, illustrating directions of cross sections used in descriptions of embodiments disclosed herein. As shown in FIG. 3, following the formation of the source-drain recess, portions of the fin 110 remain under and near the gate assemblies 140*a* and 140*b*. Transistor channels are formed substantially in these portions. A cross section B-B is defined herein as one taken along a plane perpendicular to the substrate 120 and passing through the line B-B, before or at any stage of a source-drain growth process. Likewise, a cross section C-C is defined as one taken along a plane perpendicular to the substrate 120 and passing through the line C-C positioned midway between the gate assemblies 140*a* and 140*b*, before or at any stage of a source-drain growth process. Note that, although only one fin is illustrated in the perspective view of FIG. 3, it is contemplated that in many embodiments two or more fins 110 are formed adjacent and substantially parallel to one another and further that respective source-drain regions are grown over fin recesses, as illustrated in FIGS. 4-6.

In accordance with various embodiments, thin layers of low germanium content are disposed in the source-drain region to improve epitaxial growth of source-drain structures, without lowering the overall germanium content of said source-drain structures significantly, thus maintaining advantageously high stress on transistor channels. Such thin layers are herein referred to as seeding layers.

Herein, any layer grown prior to the deposition of a first seeding layer is referred to as a pre-seeding layer. In various embodiments, there may be no pre-seeding layer, or there may be one or more pre-seeding layers. In addition, any layer grown on and adjacent a seeding layer is referred to as a seeded layer. Any layers grown subsequent to a seeded layer and prior to the growth of the next seeding layer are referred to as intervening layers. Finally, embodiments may optionally include one or more layers on the last seeded layer. Such layers are herein referred to as final layers.

In an embodiment, two seeding layers may be used in a p-type FinFET source-drain structure. FIG. 4 contains cross-sectional views of an embodiment of a p-type FinFET source-drain structure comprising two seeding layers. Referring first to the B-B view, gates 210 and side regions 403 are disposed over the fin 110. In various embodiments, the fin 110 may be $Si_{1-x}Ge_x$ with the Ge content x in the range between zero (Si) and 40%. The side regions 403 may be silicon nitride, or comprise one or more layers of silicon nitride, silicon oxide, or the like. Gate dielectrics are not shown. Following a source-drain recess step, the fin 110 remains under the gates 210 and the side regions 403, but is etched to a recess 260 therebetween. Fin material remains below the recess 260.

In the C-C view, traces 405 depict cross sections of two fins prior to the source-drain recess step. Following the recess step, the fins are substantially removed through etching to recesses 260 for both fins. Fin material remains as stems below the recesses 260. Fin sidewalls 409 and 407, composed of silicon oxide, silicon nitride, or the like and disposed adjacent fins in earlier stages of the manufacturing process, may remain after the fin recess step.

In an embodiment, a pre-seeding layer 410 is grown in the fin recess 260. As shown in the B-B view, the pre-seeding layer 410 grows at the bottom and on the sidewalls of the recess 260. As depicted in the C-C view, the pre-seeding layer 410 grows at the bottom of the recesses 260 on the stems of both fins. In various embodiments, the pre-seeding layer 410 may be or include Si, $Ge_x$, $Si_{1-z}Ge_z$ of any germanium content z between about zero and about 100%, or be or include other materials. In an embodiment, the pre-seeding layer 410 may be of the same material and composition as the fin 110. In some embodiments, the fin 110 may be $Si_{1-x}Ge_x$, and the pre-seeding layer 410 may be $Si_{1-y}Ge_y$ with the germanium content y substantially fixed and equal to or larger than x, or the pre-seeding layer may be graded, with the germanium content y initially less than 20% and increasing to a value larger than x as growth of the pre-seeding layer proceeds. For example, the fin 110 may be $Si_{0.8}Ge_{0.2}$ and the pre-seeding layer may be a graded layer of $Si_{1-y}Ge_y$, with y initially equal to zero (Si) and then rising to 50%. In another example, the fin 110 may be $Si_{0.8}Ge_{0.2}$ and the pre-seeding layer may be $Si_{0.4}Ge_{0.6}$. In some embodiments, the thickness of the pre-seeding layer, as measured perpendicular to and from the bottom of the recess 260, may be less than or equal to about 50 nm (nanometers). A first seeding layer 415 is then grown on the pre-seeding layer 410. To maintain overall clarity in FIG. 4, the thickness of the first seeding layer 415 and the thicknesses of any subsequent seeding layers disclosed below are not explicitly illustrated. The shape of the pre-seeding layer 410 near the side regions 403 is a consequence of differing rates of growth on different crystal planes. As noted above, in other embodiments, no pre-seeding layer may be grown and the first seeding layer 415 may be grown on the fin material in the fin recess 260. Following the growth of the first seeding layer 415, a first seeded layer 420 is grown on the first seeding layer 415. Referring to the C-C view, at some time during the growth of the source-drain region, materials growing on adjacent fins may join to form a connected source-drain structure, leaving an air gap 423. After the air gap 423 is formed, supply of precursors for further growth in the air gap area is dramatically reduced and little additional growth takes place in the air gap 423. In FIG. 4, the air gap 423 is formed during the growth of the first seeded layer 420. Following the growth of the first seeded layer 420, a second seeding layer 425 is grown on the first seeded layer 420. Next, a second seeded layer 430 is grown on the second seeding layer 425, reaching an outer contour 443. Subsequently, a final layer 450 is deposited on the second seeded layer 430, reaching a final outer contour 453. The outer contour 453 is the final outer contour of the source-drain structure grown in this embodiment. The shapes of the second seeding layer 425 and the outer and final contours 443 and 453 are shown in FIG. 4 as substantially piecewise linear. However, it is recognized herein that the shapes of various layers and the contours of the source-drain structure at various stages of the growth process may be substantially piecewise linear, curved, undulating, or have other shapes, in various embodiments.

In various embodiments, the seeding layers 415 and 425 may be Si or $Si_{1-x}Ge_x$ with the Ge content x in the range between about zero and about 20%, and the seeded layers 420 and 430 may be Ge or $Si_{1-y}Ge_y$ with the Ge content y in the range between about 10% and about 100%, and the Ge content y of any seeded layer may be larger than the Ge content x of a seeding layer adjacent and underneath it by at least 0.07, or equivalently 7%. Herein, the difference in two values w and z of Ge content, when presented in percent, is intended to reflect the absolute difference in the values of w and z, and not the relative difference relative to either w or z. For example, a first Ge content 7% lower than a second Ge content of 10% is 3%, and not 9.3%. In an embodiment, the Ge content of a seeded layer may be 10% and the Ge content of the seeding layer adjacent and underneath it may be 3%. In various embodiments, intervening layers, and final layers may be or include Si, $Ge_x$, $Si_{1-z}Ge_z$ of any germanium content z between about zero and about 100%, or be or include other materials.

The thicknesses of the first and second seeding layers 415 and 425 may be in the range between 1 monolayer and 5 nanometers, and may or may not be the same. Information on the thicknesses of pre-seeding, seeded, and final layers is provided further below. The compositions and thicknesses of seeding layers may or may or not be equal. Likewise, the composition and thicknesses of seeded layers may or may not be equal.

The embodiment of FIG. 4 offers several advantages. The use of seeding layers assists the growth of seeded layers. This in turn improves the uniformity of source-drain regions across the many FinFET transistors commonly present on an integrated circuit. Uniformity in high crystal quality is enhanced. Uniformity in the final shape of the source-drain structure, represented by the outer contour 453, is also improved. As a result, electrical parameters such as source-drain resistance and silicide resistance are more uniformly favorable. Furthermore, the uniformity in the level of stress applied to the FinFET channel regions of different transistors is enhanced, without significant degradation in the absolute value of said stress. This occurs because the seeding layers are typically thin in comparison to the total thickness of the source-drain structure. As a result, any reduction in the average germanium content of the source-drain region due to the incorporation of the seeding layers is more than offset by their advantageous role in assisting the growth of seeded layers. Indeed, in certain embodiments, the thickness of the seeding layers may be selected to be about the minimum required to ensure satisfactory growth of seeded layers, within the range given above.

In certain applications, the use of a larger number of seeding layers may be more advantageous, as each seeding layer assists the growth of the subsequent seeded layer. FIG. 5 contains cross-sectional views of an embodiment of a p-type FinFET source-drain structure comprising three seeding layers. In this embodiment, a pre-seeding layer 510 is grown in the fin recess 260. As shown in the B-B view, the pre-seeding layer 510 grows at the bottom and on the sidewalls of the recess 260. As depicted in the C-C view, the pre-seeding layer 510 grows at the bottom of the recesses 260 on the remaining stems of both fins. A first seeding layer 515 is then grown on the pre-seeding layer 510. To maintain overall clarity in FIG. 5, the thickness of the first seeding layer 515 and the thicknesses of any subsequent seeding layers disclosed below are not explicitly shown. Following the growth of the first seeding layer 515, a first seeded layer 520 is grown on the first seeding layer 515. A second seeding layer 525 is grown on the first seeded layer 520. Next, a second seeded layer 530 is grown on the second seeding layer 525 and a third seeding layer 535 is grown on the second seeded later 530. A third seeded layer 540 is then grown on the third seeding layer 535, reaching an outer contour 543. Subsequently, a final layer 550 is deposited on the third seeded layer 540, reaching a final outer contour 553. The outer contour 553 is the final outer contour of the source-drain structure grown in this embodiment. The shapes of the second and third seeding layer 425 and 435 and the outer and final contours 543 and 553 are shown in FIG. 5 as substantially piecewise linear. However, it is recognized herein that the shapes of various layers and the contours of the source-drain structure at various stages of the growth process may be substantially piecewise linear, curved, undulating, or have other shapes, in various embodiments.

The thicknesses and compositions of the layers 510, 515, 520, 525, 530, and 550 of FIG. 5 may or may not be the same as the thicknesses and compositions of the layers 410, 415, 420, 425, 430, and 450 of FIG. 4. In addition, the contours 543 and 553 may not be of the same size or shape as the contours 443 and 453.

In various embodiments, the seeding layers 515, 525, and 535 may be Si or $Si_{1-x}Ge_x$, with the Ge content x in the range between about zero and about 20%, and the seeded layers 520, 530, and 540 may be Ge or $Si_{1-y}Ge_y$, with the Ge content y in the range between about 10% and about 100%, and the Ge content of any seeded layer may be larger than the Ge content of a seeding layer adjacent and underneath it by at least 0.07, or equivalently 7%. In various embodiments, the thicknesses of the first and second, and third seeding layers 515, 525, and 535 may be in the range between 1 monolayer and 5 nanometers. Furthermore, the thicknesses and Ge contents of the first, second, and third seeding layers 515, 525, and 535 may or may not be equal to one another in any combination. Furthermore, the thicknesses, compositions, or other features of the layers 510, 515, 520, 525, and 530, the contours 543 and 553, the final layer 550, and the air gap 523 of the embodiment illustrated in FIG. 5 may be different from those of the layers 410, 415, 420, 425, and 430, the contours 443 and 453, the final layer 450, and the air gap 423 of the embodiment depicted in FIG. 4.

FIG. 6 contains schematic cross-sectional views of an embodiment of a p-type FinFET source-drain structure, with reference labels in relation to FIG. 7. FIG. 7 is a table containing ranges of sizes corresponding to the features labeled in FIG. 6. In various embodiments, thicknesses of seeded layers are selected to achieve a target value for the amount by which a final contour 610 extends above the top of the fins, given values selected for the bottom thickness O of any pre-seeding layer, the thickness N of any final layer, and the number and the thicknesses of seeding layers selected from the range labeled T. This target value labeled M and described as the final extent over fin in FIGS. 6 and 7, may be in the range from −10 to 20 nm, with negative values indicating that the outer contour 610 falls short of the fin top. Similarly, negative values in the range given for extent of the first seeded layer over fin top position, Q, indicate that the highest point reached by the first seeded layer falls short of the fin top. Zero values for the bottom and sidewall thicknesses of the pre-seeding layer, labeled O and P, and the thickness of the final layer, labeled N, indicate that these layers may not be present in some embodiments.

In other embodiments, four or more seeding layers may be employed. The number of seeding layers can be comparatively large in applications where the desired total thickness of the epitaxial structure is comparatively large. Furthermore, thinner seeding layers may be used advantageously to allow a larger number of seeding layers.

In yet other embodiments, one or more of pre-seeding, seeding, seeded, intervening, and final layers may include tin (Sn). For example, one or more seeding layers may be Si or $Si_{1-x}Ge_x$, while one or more seeded layers may be $Si_{1-z}Sn_z$ or $Ge_{1-w}Sn_w$. In another example, one or more seeding layers may be or $Si_{1-y}Sn_y$, while one or more seeded layers may be $Ge_{1-x}Sn_w$, or $Si_{1-z}Sn_z$ with z larger than y by at least 0.07 (7%).

It is recognized herein that a layer may or may not begin or end at an abrupt change in composition and may or may not have uniform composition or uniform thickness. Generally, any material grown between a first instant in time and a second instant in time during the growth of the entire source-drain structure is considered herein to be a layer. In addition, any layer may be considered to include sub-layers, themselves layers grown between instants of time between said first and second instants of time and inclusive of them.

Where the growth front is planar, a layer may have non-uniform thickness due to variations in parameters such as the local temperature of the substrate. Where the growth front is non-planar, as in the case of FinFET source-drain regions, a layer may have non-uniform thickness due to differences in growth rates on differing crystal orientations. In addition, a layer may begin or end on a non-smooth surface exhibiting roughness. For example, when material equivalent to only a few monolayers, or to less than one monolayer, is deposited on a highly lattice-mismatched underlying layer, the resulting layer may not cover the entire underlying surface and instead grow in patches or form hillocks.

A layer may begin with or without an abrupt change in composition, contain within it gradual or abrupt changes of composition, and end with or without an abrupt change in composition. It is also recognized herein that where the growth front includes differing crystal orientations, variations in stoichiometry may exist between said orientations.

In various embodiments, one or more seeding or seeded layers may be of gradually varying (graded) composition, compositions varying stepwise, or combinations thereof. In an embodiment, one or both seeding layers 415 and 425 may consist of two sub-layers with germanium contents of zero (silicon) and about 21% ($Si_{0.79}Ge_{0.21}$), with an approximate average germanium content of less than 20%. In another embodiment, one or both seeded layers 420 and 430 may consist of three sublayers with germanium contents of 8%, 12%, and 15%, with an approximate average germanium content of more than 10%.

In another embodiment, following a pre-seeding layer, growth begins with a germanium content of zero (silicon) and the germanium content is gradually and monotonically increased to 50%. In such an embodiment, a layer construed to begin at a germanium content of zero (silicon) and end at a germanium content x, wherein the approximate average germanium content is less than 20%, constitutes a seeding layer. Likewise, a layer construed to begin at a germanium content of x and ending at a germanium content of 20%, wherein the approximate average germanium content is more than 10%, constitutes a seeded layer.

In another embodiment, growth of a source-drain region includes a sequence of gradual increases and decreases in composition, wherein a layer with an approximate average composition of more than 25% lies on and adjacent a layer with an approximate average composition of less than 20%. Said layers are herein construed as seeded and seeding layers, respectively.

In other embodiments, one or more seeding layers may be $Si_{1-x-y}C_xGe_y$, wherein the germanium content y is between zero and about 20%. Likewise, in some embodiments, one or more seeded layers may be $Si_{1-w-z}C_wGe_z$, wherein the germanium content z is between about 10% and 100%.

Figure 8:
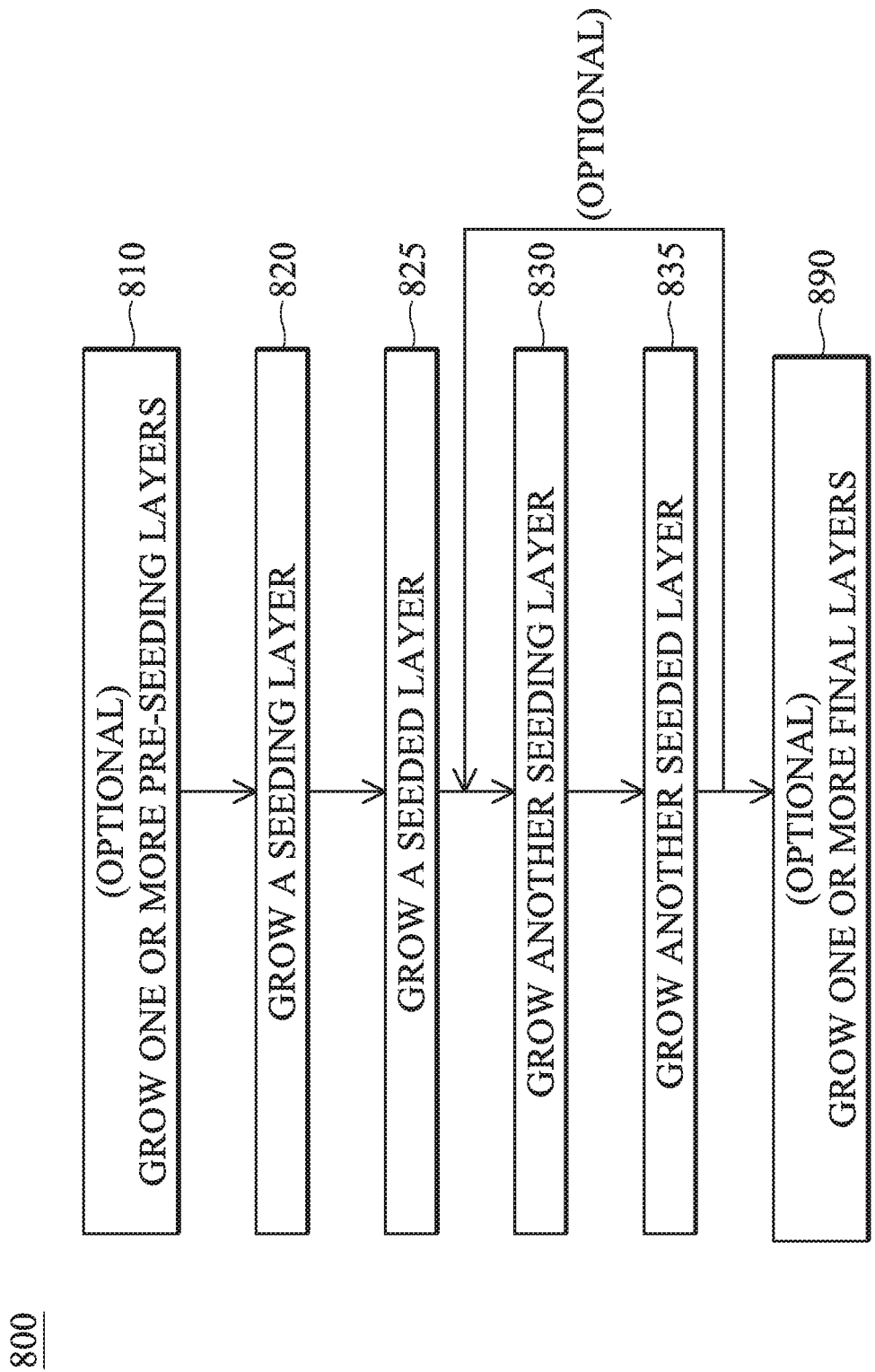
FIG. 8 is an illustration of an embodiment of a method for epitaxial growth of a p-type FinFET source-drain region.

FIG. 8 is an illustration of an embodiment of a method 800 for growth of a p-type FinFET source-drain region. The growth process may be selective epitaxial growth and HCl may be used in the growth process. In optional step 810, one or more pre-seeding layers are grown. Next, in a step 820, a seeding layer is grown. The method continues with the growth of a seeded layer in a step 825. Subsequently, another seeding layer and another seeded layer are grown in steps 830 and 835, respectively. The seeding layers grown in steps 820 and 830 may or may not have the same thickness or composition. Likewise, the seeded layers grown in steps 825 and 835 may or may not have the same thickness or composition. Optionally, additional pairs of seeding and seeded layers are grown. These additional pairs of seeding and seeded layers may or may not have the same thickness or composition than those in earlier steps. Subsequent to the growth of the last seeded layer, one or more final layers may be grown in an optional step 890. Any final layers may or may not have the same thickness(es) and/or composition(s) as those disclosed herein for seeding layers.

Figure 9:
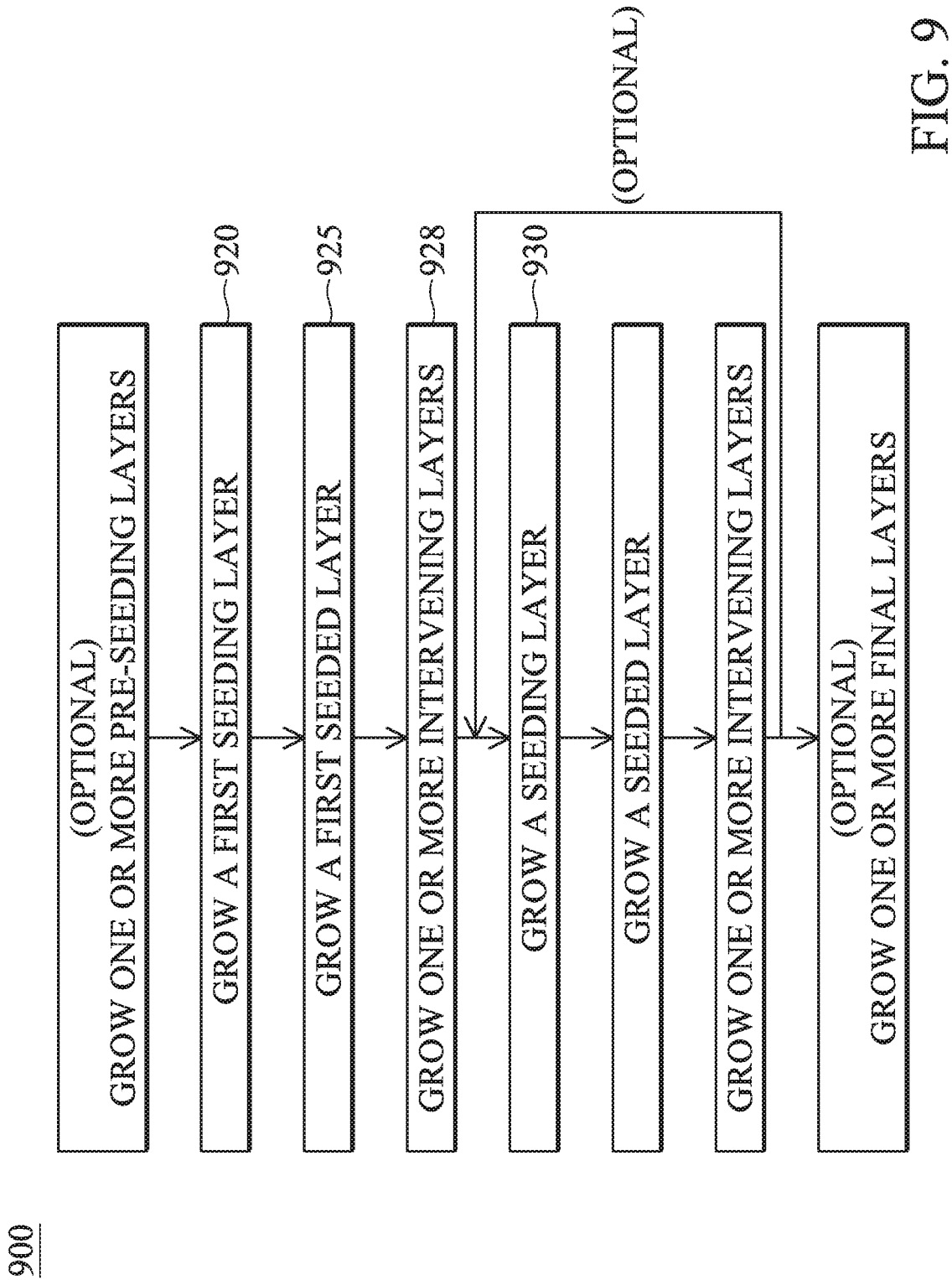
FIG. 9 is an illustration of an embodiment of a method for epitaxial growth of a p-type FinFET source-drain region including intervening layers.

In yet other embodiments, one or more intervening layers may be grown following a seeded layer and prior to the subsequent seeding layer. FIG. 9 is an illustration of an embodiment of a method 900 for growth of a p-type FinFET source-drain region including intervening layers. The growth process may be selective epitaxial growth and HCl may be used in the growth process. Following the growth of a first seeding layer in a step 920 and a first seeded layer in a step 925, one or more intervening layers are grown in a step 928, before growing a subsequent seeding layer in a step 930. For example, a first seeding layer of $Si_{0.9}Ge_{0.1}$ may be followed by a seeded layer of $Si_{0.5}Ge_{0.5}$, and an intervening layer of $Si_{0.6}Ge_{0.4}$ may be grown on the seeded layer before the growth of a second seeding layer of $Si_{0.9}Ge_{0.1}$.

As noted above, in other embodiments, methods for growth of p-type FinFET source-drain regions may include layers beginning or ending with or without an abrupt changes in composition and/or layers with graded composition or comprising sublayers of graded or fixed composition.

It will also be readily understood by those skilled in the art that materials and methods may be varied while remaining within the scope of the present disclosure. It is also appreciated that the present disclosure provides many applicable inventive concepts other than the specific contexts used to illustrate embodiments. Accordingly, the appended claims are intended to include within their scope such processes, machines, manufacture, compositions of matter, means, methods, or steps.

In an embodiment, a transistor includes a source-drain region, the source-drain region includes a first layer wherein a first average silicon content is between about 80% and 100%, and a second layer wherein a second average silicon content is between zero and about 90%, the second average silicon content being smaller than the first average silicon content by at least 7%, and the second layer disposed on and adjacent the first layer, a third layer wherein a third average silicon content is between about 80% and 100%, and a fourth layer wherein a fourth average silicon content is between zero and about 90%, the fourth average silicon content being smaller than the third average silicon content by at least 7% and the fourth layer disposed on and adjacent the third layer.

In an embodiment, an integrated circuit includes a FinFET, the source-drain region of the FinFET including a first layer wherein a first average germanium content is between zero and about 20%, a second layer wherein a second average germanium content is between about 10% and 100%, the second average germanium content being larger than the first average germanium content by at least 7%, and the second layer disposed on and adjacent the first layer, a third layer wherein a third average germanium content is between zero and about 20%, and a fourth layer wherein a fourth average germanium content is between about 10% and 100%, the fourth average germanium content being larger than the third average germanium content by at least 7%, and the fourth layer disposed on and adjacent the third layer.

In an embodiment, a method of forming a semiconductor material using an epitaxial growth process is provided, the method including growing a first layer wherein a first average germanium content is between zero and about 20%, growing a second layer wherein a second average germanium content is between about 10% and 100% on and adjacent the first layer, the second average germanium content being larger than the first average germanium content by at least 7%, growing a third layer wherein a third average germanium content is between zero and about 20%, and growing a fourth layer wherein a fourth average germanium content is between about 10% and 100% on and adjacent the third layer, the fourth average germanium content being larger than the third average germanium content by at least 7%.

What is claimed is:

1. A transistor comprising a source-drain region, the source-drain region comprising:
    a substrate;
    a first layer wherein a first average silicon content of the first layer is between about 80% and 100%,
    a second layer wherein a second average silicon content of the second layer is between zero and about 90% the second average silicon content being smaller than the first average silicon content by at least 7%, and the second layer disposed directly on and overlying the first layer, relative to the substrate, wherein an interface between the first layer and the second layer is non-linear,
    a third layer directly contacting and overlying the second layer, relative to the substrate, wherein a third average silicon content of the third layer is between about 80% and 100%, wherein an interface between the third layer and the second layer is multi-faceted, and
    a fourth layer directly contacting and overlying the third layer, relative to the substrate, wherein a fourth average silicon content of the fourth layer is between zero and about 90%, the fourth average silicon content being smaller than the third average silicon content by at least 7%, and the fourth layer disposed on and adjacent the third layer, wherein the outermost surface of the fourth layer is multi-faceted.

2. The transistor of claim 1, wherein said transistor is a FinFET.

3. The transistor of claim 2, wherein the FinFET is p-type.

4. The transistor of claim 1, wherein at least one of the second and fourth layers is silicon germanium.

5. The transistor of claim 1, wherein a first average germanium content of the first layer is between zero and about 20%,
    a second average germanium content of the second layer is between about 10% and 100%, the second average germanium content being larger than the first average germanium content by at least 7%,
    a third average germanium content of the third layer is between zero and about 20%, and
    a fourth average germanium content of the fourth layer is between about 10% and 100%, the fourth average germanium content being larger than the third average germanium content by at least 7%.

6. The transistor of claim 1, wherein the thickness of at least one of the first and third layers is between 1 monolayer and 5 nanometers.

7. The transistor of claim 1, wherein said source-drain region further comprises:
    a fifth layer wherein a fifth average silicon content is between about 80% and 100%, and
    a sixth layer wherein a sixth average silicon content is between zero and about 90%, the sixth average silicon content being smaller than the fifth average silicon content by at least 7%, and the sixth layer disposed on and adjacent the fifth layer.

8. The transistor of claim 3, wherein:
the first layer is $Si_{1-x}Ge_x$ and x is between zero and about 20%, and the thickness of the first layer is between 1 monolayer and 5 nanometers, and
the third layer is $Si_{1-y}Ge_y$ where y is between zero and about 20%, and the thickness of the third layer is between 1 monolayer and 5 nanometers.

9. An integrated circuit comprising:
a first fin and a second fin adjacent the first fin;
a source-drain region between the first and second fin and electrically contacting both the first fin and the second fin, the source-drain region including:
  a first layer having a first average germanium content between zero and about 20%, the first layer extending over a recessed portion of the first fin and extending over a recess portion of the second fin, but not extending between the first fin and the second fin,
  a second layer having a second average germanium content between about 10% and 100%, the second average germanium content being larger than the first average germanium content by at least 7%, the second layer disposed on the first layer, the second layer further extending between the first fin and the second fin, wherein an interface between the first layer and the second layer is non-linear;
  a third layer having a third average germanium content between zero and about 20%, the third layer being directly on and contacting the second layer, wherein an interface between the third layer and the second layer is multi-faceted; and
  a fourth layer having a fourth average germanium content between about 10% and 100%, the fourth average germanium content being larger than the third average germanium content by at least 7%, and the fourth layer disposed directly on and contacting the third layer, wherein the outermost surface of the fourth layer is multi-faceted.

10. The integrated circuit of claim 9, wherein at least one of the first and third layers is silicon germanium.

11. The integrated circuit of claim 9, wherein the thickness of at least one of the first and third layers is between 1 monolayer and 5 nanometers.

12. The integrated circuit of claim 9, wherein said source-drain region further comprises:
a fifth layer wherein a fifth average germanium content is between zero and about 20%, and
a sixth layer wherein a sixth average germanium content is between about 10% and 100%, the sixth average germanium content being larger than the fifth average germanium content by at least 7%, and the sixth layer disposed on and adjacent the fifth layer.

13. The integrated circuit of claim 9, wherein
the first layer is $Si_{1-x}Ge_x$ and x is between zero and about 20%, and the thickness of the first layer is between 1 monolayer and 5 nanometers, and
the third layer is $Si_{1-y}Ge_y$ and y is between zero and about 20%, and the thickness of the third layer is between 1 monolayer and 5 nanometers.

14. A method of forming a semiconductor material using an epitaxial growth process, the method comprising:
epitaxially growing a first layer wherein a first average germanium content of the first layer is between zero and about 20%,
epitaxially growing a second layer directly on the first layer using the first layer as a seeding layer, wherein a second average germanium content of the second layer is between about 10% and 100% on and adjacent the first layer, the second average germanium content being larger than the first average germanium content by at least 7%, wherein an interface between the first layer and the second layer is non-linear,
epitaxially growing a third layer directly on the second layer, wherein a third average germanium content of the third layer is between zero and about 20%, wherein an interface between the third layer and the second layer is multi-faceted, and
epitaxially growing a fourth layer directly on the third layer using the third layer as a seeding layer, wherein a fourth average germanium content of the fourth layer is between about 10% and 100% on and adjacent the third layer, the fourth average germanium content being larger than the third average germanium content by at least 7%, and wherein the outermost surface of the fourth layer is multi-faceted.

15. The method of claim 14, wherein one more of the layers is grown using vapor-phase epitaxy.

16. The method of claim 14, wherein one more of the layers is grown using selective epitaxial growth process.

17. The method of claim 14, wherein one more of the layers is grown using hydrogen chloride in an epitaxial growth process.

18. The method of claim 14, wherein the thickness of at least one of the first and third layers is between 1 monolayer and 5 nanometers.

19. The method of claim 14, wherein the first, second, third, and fourth layers are silicon germanium.

20. The method of claim 14, further comprising:
growing a fifth layer wherein a fifth average germanium content is between zero and about 20%, and
growing a sixth layer wherein a sixth average germanium content is between about 10% and 100% on and adjacent the fifth layer, the sixth average germanium content being larger than the fifth average germanium content by at least 7%.

* * * * *